US006342711B1

United States Patent
Van Buskirk et al.

(10) Patent No.: US 6,342,711 B1
(45) Date of Patent: Jan. 29, 2002

(54) CONFINEMENT OF E-FIELDS IN HIGH DENSITY FERROELECTRIC MEMORY DEVICE STRUCTURES

(75) Inventors: Peter C. Van Buskirk, Newtown; Steven M. Bilodeau, Oxford, both of CT (US)

(73) Assignee: Advanced Technology Materials, Inc., Danbury, CT (US)

(*) Notice: Subject to any disclaimer, the term of this patent is extended or adjusted under 35 U.S.C. 154(b) by 0 days.

(21) Appl. No.: 09/264,047

(22) Filed: Mar. 8, 1999

(51) Int. Cl.[7] .............................................. H01L 29/76
(52) U.S. Cl. ....................... 257/295; 257/310; 257/532
(58) Field of Search ................................ 257/295, 310, 257/532; 438/3

(56) References Cited

U.S. PATENT DOCUMENTS

| 5,366,920 A | * 11/1994 | Yamamichi et al. | 257/295 |
| 5,633,781 A | * 5/1997 | Saenger et al. | 257/296 |
| 5,638,319 A | * 6/1997 | Onishi et al. | 257/295 |
| 5,645,976 A | * 7/1997 | Azuma | 430/313 |
| 5,679,969 A | * 10/1997 | Evans, Jr. et al. | 257/295 |
| 5,874,755 A | 2/1999 | Ooms et al. | 257/295 |
| 6,051,858 A | * 4/2000 | Uchida et al. | 257/295 |

OTHER PUBLICATIONS (Scott, James F., "Layered perovskite thin films and memory devices," *Thin film Ferroelectric Materials and Devices*, R. Ramesh, Ed. Kluwer Academic Publishers, Boston, 1997, pp. 134–139.

* cited by examiner

*Primary Examiner*—Sara Crane
(74) *Attorney, Agent, or Firm*—Steven J. Hultquist; Yongzhi Yang; Margaret M. Chappuis

(57) ABSTRACT

A ferroelectric capacitor device structure, including a ferroelectric stack capacitor comprising a ferroelectric material capacitor element on a substrate containing buried transistor circuitry beneath an insulator layer having a via therein containing a conductive plug to the transistor circuitry, wherein E-fields are structurally confined to the ferroelectric capacitor material element. Such E-fields confinement may be effected by fabrication of the device structure including: (a) patterning the stack capacitor, and depositing a non-ferroelectric, high ∈ material layer over and on the sides of the stack capacitor; (b) forming the stack capacitor without patterning the ferroelectric material and rendering a portion of the material non-ferroelectric in character; or (c) forming the ferroelectric stack capacitor with an aspect ratio, of effective lateral dimension d of the ferroelectric capacitor material element to thickness t of the ferroelectric capacitor material element, that is greater than 5, with d and t being measured in same dimensional units.

22 Claims, 1 Drawing Sheet

CONFINEMENT OF E-FIELDS IN HIGH DENSITY FERROELECTRIC MEMORY DEVICE STRUCTURES

BACKGROUND OF THE INVENTION

1. Field of the Invention

This invention relates generally to structures and methods for confining E-fields in high-density ferroelectric memory applications, so that unwanted dispersion of the E-field into regions surrounding the ferroelectric material is avoided.

2. Description of the Related Art

There is a major effort by semiconductor companies throughout the world to commercialize ferroelectric thin films in advanced dynamic random access memories (DRAMs) and ferroelectric random access memories (FeRAMs), respectively.

Ferroelectric thin film materials of interest for such FeRAM applications include $PbZrTiO_3$ (PZT) and $SrBi_2Ta_2O_9$ (SBT). While the majority of current efforts are directed to the commercial development of relatively large capacitors (e.g. 5 $\mu m^2$ area), the ultimate goal is to adapt ferroelectric random access memory technology for future generations of integrated circuit devices in which capacitor areas, cell sizes and voltages are scaled downward as the technology evolves.

In high-density memory arrays, storage of adequate charge will in some cases require 3-dimensional capacitors utilizing the sidewalls of the capacitor structure to increase capacitor area in a given "footprint." That is a proposed path for implementation of SBT in FeRAM device applications, because of its relatively low switched ferroelectric polarization ($P_{sw}$) characteristic, typically less than 20 $\mu C/cm^2$. PZT thin films have higher $P_{sw}$ (>40 $\mu C/cm^2$), and for that reason planar capacitors based on PZT thin films may be extended to higher integration densities. Planar capacitors are attractive to avoid the complications of controlling composition, crystalline orientation and ferroelectric characteristics on capacitor sidewalls.

By way of example, device technology in the F=0.18 $\mu m$ regime is expected to target capacitors with 0.1 $\mu m^2$ projected area, which corresponds to a circular capacitor with diameter (d)=0.36 $\mu m$. (Another shape would be a rectangular capacitor with dimensions 0.2×0.5 $\mu m$.) In such cases, wherein the lateral dimensions (such as d) begin to approach the thickness of the ferroelectric thin film layer (t), the E-field due to an applied voltage at the capacitor plate tends to be driven out of the high permittivity ferroelectric, into the low permittivity surroundings This phenomenon of E-field dispersion is described by Scott (Scott, James F., "Layered perovskite thin films and memory devices," *Thin film Ferroelectric Materials and Devices*, R. Ramesh, Ed. Kluwer Academic Publishers, Boston, 1997, pp. 138). Scott refers to the circular capacitor aspect ratio d/t, to illustrate the effect on losses in switched charge, which would be the direct consequence of reduction of switching E-field within the ferroelectric. Scott states that for capacitors with d/t as low as 5, $P_{sw}$ may be decreased by about 20%. In the case of a 0.1 $\mu m^2$ capacitor, d/t≈3.6, so the effect is expected to be even larger.

In general the reduction of field in the high ∈ ferroelectric layer has been solved for the static case, but we are not aware that any solution has been found for the dynamic case, involving a nonlinear high e layer such as in a ferroelectric or paraelectric layer, with time-varying E-fields.

This effect of losses in switched charge will tend to increase the voltage needed to switch the ferroelectric, and it will also project the applied E-fields into adjacent memory cells, with the potential result of undesired interference. Such effect may also distribute the E-fields non-uniformly within the ferroelectric layer, with deleterious effects.

It would therefore be a significant advance in the art and is accordingly an object of the present invention to provide a ferroelectric device architecture that will efficiently confine the E-field (at a given voltage characteristic) within the ferroelectric layer that is to be switched.

Other objects and advantages of the invention will be more fully apparent from the ensuing disclosure and appended claims.

SUMMARY OF THE INVENTION

The present invention relates generally to structures and methods for confining E-fields in high-density ferroelectric memory applications to minimize unwanted dispersion of the E-field into regions surrounding the ferroelectric material.

In one aspect, the invention relates to a method of fabricating a ferroelectric capacitor device structure, including forming a ferroelectric stack capacitor comprising a ferroelectric material capacitor element on a substrate containing buried transistor circuitry beneath an insulator layer having a via therein containing a conductive plug to the transistor circuitry, wherein E-fields are confined to the ferroelectric capacitor material element in said structure by a fabrication process step selected from the group consisting of:

(a) patterning the stack capacitor, and depositing a non-ferroelectric, high ∈ insulating layer over and on the sides of the stack capacitor;

(b) patterning the stack capacitor, depositing an insulating capping layer on the patterned stack capacitor to prevent electrical short-circuiting between top and bottom electrodes of the stack capacitor, and depositing a conducting layer over and on the sides of the stack capacitor;

(c) forming the stack capacitor without patterning the ferroelectric material so that deposited ferroelectric material comprises a region aligned with top and bottom electrodes of the stack capacitor defining the ferroelectric capacitor material element and ferroelectric material outside of said region, and rendering the ferroelectric material outside of said region non-ferroelectric in character, by at least one of the steps of:

(1) growing the ferroelectric material outside of said region on a different surface;

(2) chemically modifying the ferroelectric material outside of said region by in-diffusion of a sacrificial layer thereinto;

(3) ion implanting the ferroelectric material outside of said region with an ionic species rendering said region non-ferroelectric in character;

(4) damaging the crystal lattice of the ferroelectric material outside of said region by ion or electron bombardment thereof; and (5) heat treating the ferroelectric to remove volatile constituents (i.e. Pb, or Bi). This may be accelerated in a reducing environment (i.e. $H_2$, forming gas or ammonia).

(d) forming the ferroelectric stack capacitor with an aspect ratio, of effective lateral dimension d of the ferroelectric capacitor material element to thickness t of the ferroelectric capacitor material element, that is greater than 5, with d and t being measured in same dimensional units.

Another aspect of the invention relates to a method of fabricating a stack capacitor array on a substrate containing buried transistor circuitry beneath a insulator layer having vias therein containing conductive plugs to the transistor circuitry, said method comprising the steps of:

forming a conductive barrier layer on the substrate;

forming a stack capacitor structure on the conductive barrier layer, by the steps including:

depositing a bottom electrode layer on the conductive barrier layer;

depositing a ferroelectric material layer on the bottom electrode layer;

depositing a top electrode layer on the ferroelectric material layer; and etching the multilayer structure comprising the bottom electrode layer, ferroelectric material layer and top electrode layer, to define a stack capacitor structure;

conformally depositing over the stack capacitor structure including top and sides thereof an E-field confinement layer;

depositing on the E-field confinement layer an interlayer dielectric; and forming metallization contacts to the top electrode layer through the interlayer dielectric and E-field confinement layer.

The E-field confinement layer in such method may be either an insulative material, or alternatively a conductive material deposited over an interposed insulative capping layer to prevent short-circuiting between the respective electrodes.

A further aspect of the invention relates to a method of fabricating a stack capacitor array on a substrate containing buried transistor circuitry beneath a insulator layer having vias therein containing conductive plugs to the transistor circuitry, said method comprising the steps of:

forming a conductive barrier layer embedded in the insulator layer on the substrate;

forming a stack capacitor structure on the conductive barrier layer, by the steps including:

depositing a bottom electrode layer on the conductive barrier layer so that the bottom electrode layer is also embedded in the insulator layer on the substrate;

depositing a ferroelectric material layer on the bottom electrode layer; and depositing a top electrode layer on the ferroelectric material layer;

depositing on the stack capacitor structure an interlayer dielectric; and forming metallization contacts to the top electrode layer through the interlayer dielectric;

wherein the stack capacitor is formed without patterning the ferroelectric material layer so that the deposited ferroelectric material layer comprises a layer including (i) a region aligned with top and bottom electrodes of the stack capacitor defining a ferroelectric capacitor material element and (ii) material of said layer outside of said region, further comprising rendering the material outside of said region non-ferroelectric in character, by at least one of the steps of:

(1) growing the ferroelectric material outside of said region on a different surface;

(2) chemically modifying the ferroelectric material outside of said region by in-diffusion of a sacrificial layer thereinto;

(3) ion implanting the ferroelectric material outside of said region with an ionic species rendering said region non-ferroelectric in character;

(4) damaging the crystal lattice of the ferroelectric material outside of said region by ion or electron bombardment thereof; and (5) heat treating the ferroelectric to remove volatile constituents (i.e. Pb, or Bi). This may be accelerated in a reducing environment (i.e. $H_2$, forming gas or ammonia).

The invention relates in another aspect to a ferroelectric capacitor device structure, including a ferroelectric stack capacitor comprising a ferroelectric material capacitor element on a substrate containing buried transistor circuitry beneath an insulator layer having a via therein containing a conductive plug to the transistor circuitry, wherein E-fields are structurally confined to the ferroelectric capacitor material element.

A further aspect of the invention relates to a ferroelectric device structure including a stack capacitor array on a substrate containing buried transistor circuitry beneath a insulator layer having vias therein containing conductive plugs to the transistor circuitry, said structure comprising:

a conductive barrier layer on the substrate;

a stack capacitor structure on the conductive barrier layer, including:

a bottom electrode layer on the conductive barrier layer;

a ferroelectric material layer on the bottom electrode layer;

a top electrode layer on the ferroelectric material layer; and a high ∈ material layer conformally coated on the top and sides of the stack capacitor structure;

an interlayer dielectric overlying the high ∈ material layer; and metallization contacts to the top electrode layer through the interlayer dielectric and high ∈ material layer.

Yet another aspect of the invention relates to a ferroelectric device structure including a stack capacitor array on a substrate containing buried transistor circuitry beneath a insulator layer having vias therein containing conductive plugs to the transistor circuitry, said device structure comprising:

a conductive barrier layer embedded in the insulator layer on the substrate;

a stack capacitor structure on the conductive barrier layer, including:

a bottom electrode layer on the conductive barrier layer so that the bottom electrode layer is also embedded in the insulator layer on the substrate;

a ferroelectric material layer on the bottom electrode layer;

a top electrode layer on the ferroelectric material layer;

depositing on the stack capacitor structure an interlayer dielectric; and forming metallization contacts to the top electrode layer through the interlayer dielectric;

wherein the stack capacitor is formed without patterning the ferroelectric material layer so that the ferroelectric material layer comprises a continuous layer including (i) a region of the continuous layer that is aligned with the top and bottom electrodes of the stack capacitor to define a ferroelectric capacitor material element and (ii) a portion of the continuous layer outside of said region that is non-ferroelectric in character, and has at least one of the characteristics of:

(1) having been grown on a different surface than the region (i) of the continuous layer;

(2) having a sacrificial layer in-diffused therein;
(3) being implanted with an ionic species rendering said portion of the continuous layer non-ferroelectric in character;
(4) having a crystal lattice that has been damaged by ion or electron bombardment thereof; and
(5) heat treating the ferroelectric to remove volatile constituents (i.e. Pb, or Bi). This may be accelerated in a reducing environment (i.e. $H_2$, forming gas or ammonia).

Other aspects, features and embodiments of the invention will be more fully apparent from the ensuing disclosure and appended claims.

DETAILED DESCRIPTION OF THE INVENTION, AND PREFERRED EMBODIMENTS THEREOF

Figure 1:
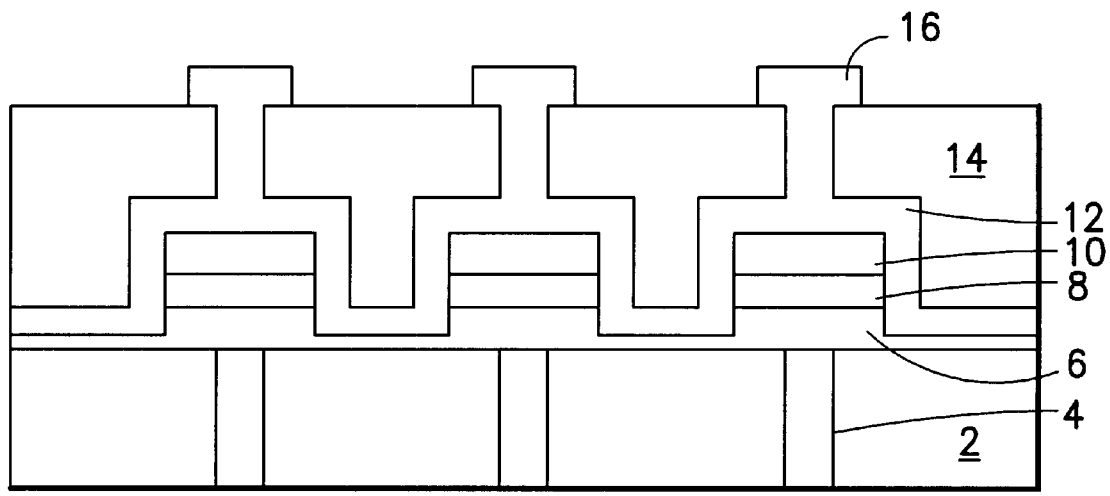
FIG. 1 is a schematic representation of a stack capacitor array in accordance with one embodiment of the invention.

The present invention contemplates various approaches to prevent unwanted dispersion of the E-fields into the regions that surround the ferroelectric material that needs to be switched in the operation of the ferroelectric device. These approaches are described in greater detail below.

One such approach includes the deposition of a non-ferroelectric, high permittivity insulating layer over and on the sides of the previously patterned capacitor stack in a capacitor precursor structure comprising such stack.

The non-ferroelectric, high permittivity insulating layer in such approach may be formed of any suitable material, as for example, $TiO_2$ ($\epsilon \approx 90$), $Ta_2O_5$ ($\epsilon \approx 40$), barium strontium titanate (BST) or doped BST ($\epsilon \approx 400$). Alternatively, the non-ferroelectric, high permittivity insulating layer may be formed of a non-ferroelectric doped or modified lead zirconium titanate (PZT) material such as $Pb_{0.09}La_{0.10}Zr_{0.65}Ti_{0.35}O_3$ or $Pb_{0.70}La_{0.30}TiO_3$, for example.

The non-ferroelectric, high permittivity insulating layer will tend to reduce propagation of E-field out of the ferroelectric capacitor. Deposition of this non-ferroelectric, high permittivity insulating layer is straightforwardly achieved using either physical vapor deposition (PVD) or chemical vapor deposition (CVD), or by oxidation of another layer such as Ti, TiN, TiAlN, etc. It is preferable that the insulating layer not react chemically with the PZT or the interlayer dielectric (ILD) in the device structure.

A second approach to preventing unwanted dispersion of the E-fields into the regions that surround the ferroelectric material that needs to be switched in the operation of the ferroelectric device, involves depositing a conductive layer over and on the sides of the previously patterned capacitor stack in a capacitor precursor structure comprising such stack.

This second approach necessarily requires the use of an insulating capping layer to prevent electrical shorting between the top and bottom electrodes of the capacitor. The insulating capping layer may be deposited according to the same methods illustratively described hereinabove for depositing the insulating layer in the first approach.

The conductive layer will completely obviate the propagation of E-field, beyond its own physical extent. The conductive layer may be comprised of electrode material (e.g., noble metal, a noble metal oxide or mixtures thereof, such as Ir, $IrO_2$, Pt, etc.) or conductive barrier layer material (Ti, TiN, TiAlN) and may be deposited by conventional means such as PVD or CVD. The conductive layer may also comprise other conductors that are typically used, such as Al, Cu, W, etc.

A third approach to preventing unwanted dispersion of the E-fields into the regions that surround the ferroelectric material that needs to be switched in the operation of the ferroelectric device, involves non-patterning of the ferroelectric layer (hereafter referred to as the "patternless" approach). By such technique, the regions adjacent the ferroelectric capacitor will contain high dielectric material, thereby minimizing the fringing fields therein.

The bottom electrode needs to be patterned prior to ferroelectric deposition, and such bottom electrode patterning may be accomplished using suitable dry etching techniques or chemical mechanical polishing (CMP) techniques.

In the patternless approach, the ferroelectric layer will extend beyond the ferroelectric capacitor, since the top electrode will generally be patterned as necessary to align with the previously patterned bottom electrode. In such case it will be advantageous for the portion of the ferroelectric material layer that is not directly between the capacitor plates to be rendered non-ferroelectric in character, in order to prevent the cross-talk between cells that would otherwise occur as a result of the partial switching of the ferroelectric material between cells.

The ferroelectric material can be rendered non-ferroelectric in various ways, including:
(i) growth of the ferroelectric material on a different surface;
(ii) chemical modification of the ferroelectric material by in-diffusion of a sacrificial layer on the ferroelectric material,
(iii) ion implantation of a suitable implantation species in the ferroelectric material; or
(iv) ion or electron bombardment induced damage to the crystal lattice
(v) heat treating the ferroelectric to remove volatile constituents (i.e. Pb, or Bi). This may be accelerated in a reducing environment (i.e. $H_2$, forming gas or ammonia).

A fourth approach for preventing unwanted dispersion of the E-fields into the regions that surround the ferroelectric material that needs to be switched in the operation of the ferroelectric device, involves maintaining the aspect ratio d/t at >5.

As the ferroelectric capacitors are scaled to smaller lateral dimensions d, corresponding to decreased length scales in the associated CMOS, the deleterious effects of fringing fields can be minimized by maintaining the aspect ratio >5. For example, a ferroelectric capacitor with an area of 0.1 $\mu m^2$, may be described as having an "effective lateral dimension" d of 0.32 $\mu m$, which is the side of a square of the same area. Achieving a d/t value of 5 will require a ferroelectric layer with a thickness t of 0.064 $\mu m$ (640 Å), to prevent undesirable E-fields from dispersing into the adjacent regions.

Referring now to the drawings, FIG. 1 is a schematic representation of a stack capacitor array that is fabricated subsequent to formation of a transistor structure (not shown in FIG. 1 for clarity) in the underlying material. This part of the stack capacitor array is fabricated by deposition of an insulator 2 over the transistors. Vias are then opened in the underlying material using microlithography and reactive ion etching (RIE), and conductive plugs 4 are formed in the vias by deposition of poly-silicon or tungsten (W) using conventional chemical vapor deposition (CVD) techniques, followed by planarization using conventional chemical mechanical polishing (CMP) or etch-back methods.

Capacitors may then be electrically connected to the transistors as needed for memory cell operation.

The capacitor layers are deposited sequentially using spin-on or dry deposition methods, such as sputtering, CVD, etc. For ferroelectric capacitors, the bottom electrode is typically comprised of noble metals such as Pt, Pd, Ir or Ru, or oxides of those materials. The bottom electrode may also be comprised of multilayers or alloys of those materials.

Between the bottom electrode and the conductive plug is a conductive barrier layer, which may be formed of metal nitrides that are oxidation-resistant, such as TaSiN or TiAlN. Element 6 in FIG. 1 denotes the combined conductive barrier and bottom electrode.

The capacitor dielectric 8 is then deposited over the combined conductive barrier and bottom electrode layer 6. The capacitor dielectric 8 may be formed of a material such as PZT, SBT, $Bi_4Ti_3O_{12}$ or any other suitable ferroelectric material. The top electrode 10 then is deposited, and in general it may be comprised of materials similar to the bottom electrode, and may be the same as or different than the bottom electrode. After these three parts (bottom electrode/conductive barrier layer 6; capacitor dielectric 8; and top electrode 10) of the capacitor are deposited, the stack is etched, either by using single or multiple patterning or etching steps.

Following formation of the capacitors, a high $\in$ layer 12 is deposited conformally over the capacitors, with a sidewall thickness that is sufficient to prevent unacceptable loss of E-field in the ferroelectric capacitor. Possible choices for the composition of the high $\in$ layer were described hereinabove and others could be chosen. The high $\in$ layer also serves as a diffusion barrier between the ferroelectric layer and the interlayer dielectric 14, which is deposited next. Alternatively, the high $\in$ layer may also serve as the interlayer dielectric layer, and in this case the residual stress in this will need to be controlled via manipulation of the deposition process parameters.

Depositing and patterning the first level of metal 16, which may comprise Ti/TiN/Al, Ta/Cu, or TaN/Cu metallization, for example, completes contact to the ferroelectric capacitors.

Figure 2:
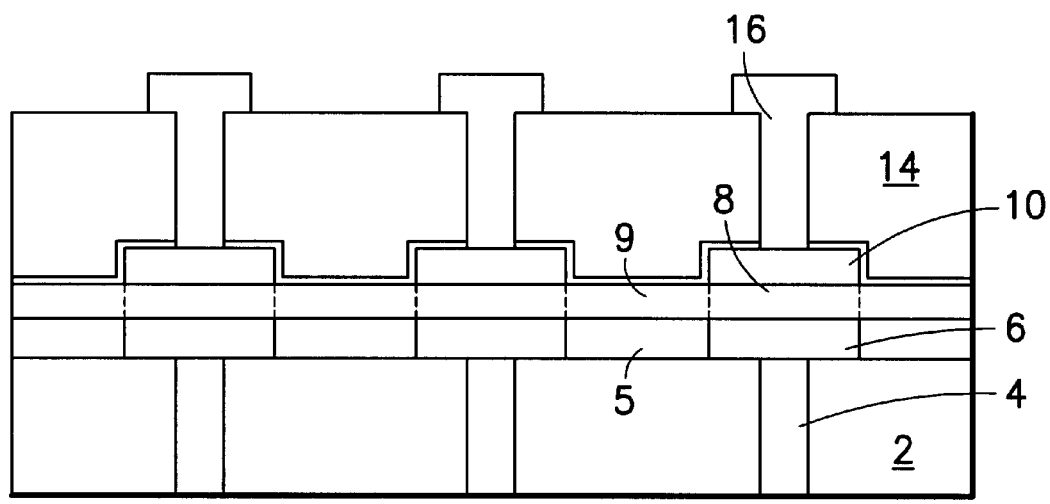
FIG. 2 is a schematic representation of a stack capacitor array in accordance with another embodiment of the invention.

FIG. 2 is a schematic representation of a stack capacitor array fabricated over a transistor structure in the underlying material, according to another embodiment of the invention.

This part of the stack capacitor array is fabricated by deposition of an insulator 2 over the transistors in the underlying material. Vias are then opened using microlithography and reactive ion etching (RIE), and conductive plugs 4 are formed in the vias by deposition of poly-silicon or W using conventional CVD techniques, followed by planarization using conventional CMP or etch-back methods.

The next part of the stacked capacitor structure comprises bottom electrodes 6 that are embedded in an insulating dielectric material 5. The insulating layer 5 is preferably fabricated from a material that is resistant to Pb or Bi diffusion, since the ferroelectric at regions 8 and 9 of the next succeeding layer is deposited directly on it. Candidate materials for insulating layer 5 are $La_2O_3$, $TiO_2$, $Ta_2O_5$, $Al_2O_3$, $Y_2O_3$, etc.

The bottom electrodes 6 are formed of a suitable noble metal-containing material, as described hereinabove. The bottom electrodes 6 are preferably fabricated by a damascene process, whereby bottom electrode recesses are formed in region 5. The bottom electrode layer is then deposited and patterned by CMP removal and planarization. Alternatively, the bottom electrode layer 6 may first be patterned using RIE, followed by fill/planarization with insulating layer 5.

Between the bottom electrode and the conductive plug is a conductive barrier layer, which may be formed of metal nitrides that are oxidation-resistant, such as TaSiN or TiAlN. Element 6 in FIG. 2 denotes the combined conductive barrier and bottom electrode.

The ferroelectric layer comprising regions 8 and 9 is then deposited on the planar surface, and the top electrode 10 is deposited and patterned to align with the bottom electrode 6.

After top electrode patterning, exposed regions 9 of the ferroelectric that are not directly within the capacitor portions of the structure are rendered non-ferroelectric, e.g., by using methods of the type described hereinabove. Alternatively, the ferroelectric material in those regions grows in a different manner on the insulating oxide relative to the bottom electrode, with the result that its ferroelectric properties are greatly or completely reduced, although it may still have an adequately high $\in$ to prevent significant loss of E-field from the ferroelectric material 8 within the capacitor portions of the structure.

The structure is then conformally coated with a Pb or Bi diffusion barrier 13 that may be similar in composition to material in layer 5, and serves the same purpose. Interlayer dielectric 14 and the first level of metal 16 then are formed above the preexisting structure to make electrical contact to the ferroelectric capacitor array, in the manner described hereinabove in connection with the stack capacitor array structure of FIG. 1.

It will therefore be apparent that the method of the invention as described hereinabove permits the fabrication of memory cell FeRAM structures that are highly suited for 0.18 micron and smaller size feature dimension applications. The method and structures of the present invention thereby achieve a substantial advance in the art, enabling high-density memory arrays to be fabricated from conventional ferroelectric materials such as PZT and SBT without deleterious cross-talk and other interference phenomena that result from dispersion of E-fields beyond capacitor loci in the capacitor array structures of the prior art.

While the invention has been illustratively described herein with reference to specific aspects, features and embodiments, it will be appreciated that the utility and scope of the invention is not thus limited and that the invention may readily embrace other and differing variations, modifications and other embodiments. The invention therefore is intended to be broadly interpreted and construed, as comprehending all such variations, modifications and alternative embodiments, within the spirit and scope of the ensuing claims.

What is claimed is:

1. A ferroelectric capacitor device structure, including a ferroelectric stack capacitor comprising a ferroelectric material capacitor element on a substrate containing buried transistor circuitry beneath an insulator layer having a via therein containing a conductive plug to the transistor circuitry, wherein said ferroelectric stack capacitor comprises:

a bottom electrode layer on a conductive barrier layer on the substrate, having a first end and a second end;

a ferroelectric material layer on the bottom electrode layer, having a first end and a second end, wherein the first and second ends of the ferroelectric material layer are substantially in alignment with the first and second ends of the bottom electrode layer; and a top electrode layer on the ferroelectric material layer, having a first end and a second end, wherein the first and second ends of the top electrode layer are substantially in alignment with those of the bottom electrode layer and of the ferroelectric material layer;

wherein a non-ferroelectric, high $\in$ material insulating layer is conformally coated over and on the sides of the ferroelectric stack capacitor, and wherein said non-ferroelectric, high $\in$ material insulating layer comprises a material selected from the group consisting of $Ta_2O_5$, barium strontium titanate (BST), doped BST, non-ferroelectric doped lead zirconium titanate (PZT) material, and modified PZT material.

2. A ferroelectric capacitor device structure, including a ferroelectric stack capacitor comprising a ferroelectric material capacitor element on a substrate containing buried transistor circuitry beneath an insulator layer having a via therein containing a conductive plug to the transistor circuitry, wherein said ferroelectric stack capacitor comprises:

a bottom electrode layer on a conductive barrier layer on the substrate, having a first end and a second end;

a ferroelectric material layer on the bottom electrode layer; and a top electrode layer on the ferroelectric material layer, having a first end and a second end, wherein the first and second ends of the top electrode layer are substantially in alignment with the first and second ends of the bottom electrode layer;

wherein the ferroelectric material layer is unpatterned and comprises a continuous layer including (i) a region of the continuous layer that is aligned with the first and second ends of the top and bottom electrodes of the ferroelectric stack capacitor to define the ferroelectric capacitor material element, and (ii) a portion of the continuous layer outside of said region that has been rendered non-ferroelectric in character, by at least one of the steps of:

(1) chemically modifying the ferroelectric material outside of said region by in-diffusion of a sacrificial layer thereinto;

(2) ion implanting the ferroelectric material outside of said region with an ionic species rendering the ferroelectric material outside of said region non-ferroelectric in character;

(3) damaging the crystal lattice of the ferroelectric material outside of said region by ion bombardment thereof; and (4) heat treating the ferroelectric material outside of said region to remove volatile constituents.

3. A structure according to claim 2, wherein heat-treating the ferroelectric material outside of said portion is carried out in a reducing environment.

4. A structure according to claim 1, wherein said non-ferroelectric, high $\in$ material insulating layer is formed of a material selected from the group consisting of BST, doped BST, non-ferroelectric doped PZT, and modified PZT.

5. A ferroelectric capacitor device structure, including a ferroelectric stack capacitor comprising a ferroelectric material capacitor element on a substrate containing buried transistor circuitry beneath an insulator layer having a via therein containing a conductive plug to the transistor circuitry, wherein E-fields are structurally confined to the ferroelectric capacitor material element by a non-ferroelectric, high $\in$ material insulating layer conformally coated over and on the sides of the ferroelectric stack capacitor, and wherein said insulating layer comprises a material selected from the group consisting of $Pb_{0.90}La_{0.10}Zr_{0.65}Ti_{0.35}O_3$ and $Pb_{0.70}La_{0.30}TiO_3$.

6. A structure according to claim 2, wherein the portion of the continuous layer outside of said region has been rendered non-ferroelectric in character by in-diffusion of a sacrificial layer thereinto, to chemically modify the ferroelectric material to a non-ferroelectric form.

7. A structure according to claim 2, wherein the portion of the continuous layer outside of said region has been rendered non-ferroelectric in character by ion implantation.

8. A structure according to claim 2, wherein the portion of the continuous layer outside of said region has been rendered non-ferroelectric in character by damaging the crystal lattice by ion or electron bombardment.

9. A structure according to claim 2, wherein the portion of the continuous layer outside of said region has been rendered non-ferroelectric in character by heat treating the ferroelectric to remove volatile constituents such as Pb or Bi in said portion of the continuous layer outside of said region.

10. A ferroelectric device structure including a stack capacitor array on a substrate containing buried transistor circuitry beneath an insulator layer having vias therein containing conductive plugs to the transistor circuitry, said structure comprising:

a conductive barrier layer on the substrate;

a stack capacitor structure on the conductive barrier layer, including:

a bottom electrode layer on the conductive barrier layer, having a first end and a second end;

a ferroelectric material layer on the bottom electrode layer, having a first end and a second end, wherein the first and second ends of the ferroelectric material layer are substantially in alignment with the first and second ends of the bottom electrode layer; and a top electrode layer on the ferroelectric material layer, having a first end and a second end, wherein the first and second ends of the top electrode layer are substantially in alignment with those of the bottom electrode layer and of the ferroelectric material layer; and an E-field confinement layer comprising an insulative, high $\in$ material selected from the group consisting of $Ta_2O_5$, BST, doped BST, non-ferroelectric doped PZT material, and modified PZT material, wherein said E-field confinement layer is conformally coated on the top and sides of the stack capacitor structure;

an interlayer dielectric overlying the E-field confinement layer; and metallization contacts to the top electrode layer through the interlayer dielectric and E-field confinement layer.

11. A ferroelectric device structure according to claim 10, wherein the E-field confinement layer comprises a material selected from the group consisting of BST and doped BST.

12. A ferroelectric device structure according to claim 10, wherein the E-field confinement layer comprises a material selected from the group consisting of non-ferroelectric doped PZT and modified PZT.

13. A ferroelectric device structure including a stack capacitor array on a substrate containing buried transistor circuitry beneath an insulator layer having vias therein containing conductive plugs to the transistor circuitry, said structure comprising:

a conductive barrier layer on the substrate;

a stack capacitor structure on the conductive barrier layer, including:
    a bottom electrode layer on the conductive barrier layer;
    a ferroelectric material layer on the bottom electrode layer;
    a top electrode layer on the ferroelectric material layer; and
  a conductive material layer conformally coated on the top and sides of the stack capacitor structure for confinement of E-field; and
  an insulative capping layer between the conductive material layer and the stack capacitor structure;
  an interlayer dielectric overlying the conductive material layer; and
  metallization contacts to the top electrode layer through the interlayer dielectric, the conductive material layer, and the insulative capping layer.

14. A ferroelectric device structure according to claim 13, wherein the conductive material layer coating the stack capacitor structure is formed of a material selected from the group consisting of noble metal, noble metal oxides, and mixtures thereof.

15. A ferroelectric device structure according to claim 13, wherein the conductive material layer coating the stack capacitor structure is formed of an oxidation-resistant metal nitride selected from the group consisting of TiN and T/AlN.

16. A ferroelectric device structure according to claim 13, wherein the conductive material layer coating the stack capacitor structure is formed of a conductor selected from the group consisting of Ti, Al, Cu, and W.

17. A ferroelectric device structure according to claim 14, wherein the conductive material layer coating the stack capacitor structure is formed of a material selected from the group consisting of Ir, $IrO_2$, Pt, and combinations thereof.

18. A ferroelectric device structure including a stack capacitor array on a substrate containing buried transistor circuitry beneath an insulator layer having vias therein containing conductive plugs to the transistor circuitry, said structure comprising:
  a conductive barrier layer on the substrate;
  a stack capacitor structure on the conductive barrier layer, including:
    a bottom electrode layer on the conductive barrier layer;
    a ferroelectric material layer on the bottom electrode layer;
    a top electrode layer on the ferroelectric material layer; and
  an E-field confinement layer comprising an insulative, high $\in$ material conformally coated on the tope and sides of the stack capacitor structure;
  an interlayer dielectric overlying the E-field confinement layer; and
  metallization contacts to the top electrode layer through the interlayer dielectric and E-field confinement layer;
wherein said E-confinement layer of insulative, high $\in$ material comprises a material selected from the group consisting of $Pb_{0.90}La_{0.10}Zr_{0.65}Ti_{0.35}O_3$ and $Pd_{0.70}La_{0.30}TiO_3$.

19. A ferroelectric device structure including a stack capacitor array on a substrate containing buried transistor circuitry beneath a insulator layer having vias therein containing conductive plugs to the transistor circuitry, said device structure comprising:
  a conductive barrier layer embedded in the insulator layer on the substrate;
  a stack capacitor structure on the conductive barrier layer, including:
    a bottom electrode layer on the conductive barrier layer so that the bottom electrode layer is also embedded in the insulator layer on the substrate, said bottom electrode having a first end and a second end;
    a ferroelectric material layer on the bottom electrode layer;
    a top electrode layer on the ferroelectric material layer, having a first end and a second end, wherein the first and second ends of the top electrode layer are substantially in alignment with the first and second ends of the bottom electrode layer;
  an interlayer dielectric deposited on the stack capacitor structure; and
  metallization contacts to the top electrode layer through the interlayer dielectric;
wherein the stack capacitor is formed without patterning the ferroelectric material layer so that the ferroelectric material layer comprises a continuous layer including (i) a region of the continuous layer that is aligned with the top and bottom electrodes of the stack capacitor to define a ferroelectric capacitor material element and (ii) a portion of the continuous layer outside of said region that is non-ferroelectric in character, and has at least one of the characteristics of:

(1) having a sacrificial layer in-diffused therein to chemically modify said portion of the continuous layer outside of said region;
  (2) being implanted with an ionic species rendering said portion of the continuous layer outside of said region non-ferroelectric in character;
  (3) having a crystal lattice that has been damaged by ion or electron bombardment thereof; and
  (4) heat treating the ferroelectric material in said portion of the continuous layer outside of said region to remove volatile constituents.

20. A ferroelectric device structure according to claim 19, wherein heat-treating the ferreoelectric material in said portion of the continuous layer outside of said region is carried out in a reducing enviornment.

21. A ferroelectric device structure according to claim 19, wherein the insulator layer comprises a material selected from the group consisting of $La_2O_3$, $TiO_2$, $Ta_2O_5$, $Al_2O_3$, and $Y_3O_3$.

22. A ferroekectric device structure according to claim 19, wherein the metallization contact comprises a multimetal layer including a material selected from the group consisting of Ti/TiN/Al, Ta/Cu, and TaN/Cu.

* * * * *

UNITED STATES PATENT AND TRADEMARK OFFICE
CERTIFICATE OF CORRECTION

PATENT NO.     : 6,342,711 B1
DATED          : January 29, 2002
INVENTOR(S)    : Peter C. Van Buskirk et al.

It is certified that error appears in the above-identified patent and that said Letters Patent is hereby corrected as shown below:

<u>Column 1,</u>
Line 64, after the word "high" delete "e" and substitute -- $\varepsilon$ --.

Signed and Sealed this

Ninth Day of September, 2003

JAMES E. ROGAN
*Director of the United States Patent and Trademark Office*